United States Patent
Golov (10) Patent No.: US 11,074,960 B2
(45) Date of Patent: Jul. 27, 2021

(54) INTERRUPT-DRIVEN CONTENT PROTECTION OF A MEMORY DEVICE

(71) Applicant: Micron Technology, Inc., Boise, ID (US)

(72) Inventor: Gil Golov, Backnang (DE)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/443,261

(22) Filed: Jun. 17, 2019

(65) Prior Publication Data
US 2020/0395061 A1 Dec. 17, 2020

(51) Int. Cl.
| | |
|---|---|
| *G11C 11/4078* | (2006.01) |
| *G06F 3/06* | (2006.01) |
| *G11C 11/406* | (2006.01) |
| *G11C 11/409* | (2006.01) |
| *G11C 11/4094* | (2006.01) |
| *G11C 11/4072* | (2006.01) |
| *G11C 11/4074* | (2006.01) |

(52) U.S. Cl.
CPC ........ *G11C 11/4078* (2013.01); *G06F 3/0604* (2013.01); *G06F 3/0634* (2013.01); *G06F 3/0659* (2013.01); *G06F 3/0673* (2013.01); *G11C 11/409* (2013.01); *G11C 11/4094* (2013.01); *G11C 11/40615* (2013.01)

(58) Field of Classification Search
CPC ............ G06F 1/32; G06F 11/00; G06F 12/06
See application file for complete search history.

(56) References Cited

U.S. PATENT DOCUMENTS

| | | | | |
|---|---|---|---|---|
| 6,671,816 | B1* | 12/2003 | Woo ........................ | G05F 1/465 713/330 |
| 6,948,029 | B2* | 9/2005 | Yano ...................... | G11C 11/406 711/105 |
| 6,963,969 | B2* | 11/2005 | Utsumi ..................... | G06F 1/24 713/1 |
| 7,043,617 | B2* | 5/2006 | Wiliams .............. | G06F 12/0638 365/189.15 |
| 7,139,937 | B1* | 11/2006 | Kilbourne ............. | G11C 11/406 714/47.2 |
| 2010/0162020 | A1* | 6/2010 | Maule ...................... | G11C 5/14 713/324 |

* cited by examiner

*Primary Examiner* — Getente A Yimer
(74) *Attorney, Agent, or Firm* — Greenberg Traurig (57) ABSTRACT

The disclosed embodiments describe methods, devices, and computer-readable media for protecting the integrity of volatile memory devices. In one embodiment, a method is disclosed comprising detecting a power interrupt condition of a memory device; and executing at least one operation in response to detecting the power interrupt condition, the operation selected from the group of operations consisting of: placing the memory device in a pre-charge mode, pausing a self-refresh mode of the memory device, forcing the memory device into a reset mode, or rewriting data in the memory device.

20 Claims, 5 Drawing Sheets

INTERRUPT-DRIVEN CONTENT PROTECTION OF A MEMORY DEVICE

COPYRIGHT NOTICE

This application includes material that is subject to copyright protection. The copyright owner has no objection to the facsimile reproduction by anyone of the patent disclosure, as it appears in the Patent and Trademark Office files or records, but otherwise reserves all copyright rights whatsoever.

BACKGROUND

Applications that contain sensitive data stored in dynamic random-access memory (DRAM) require such data be protected against unauthorized access. One example of such applications are automotive applications.

To gain unauthorized access to a DRAM, malicious users remove the DRAM from its circuit board while the DRAM is in a self-refresh or standby mode. In the automotive context, a DRAM is in such a mode when the vehicle housing the DRAM is powered off. A malicious user can unsolder the DRAM from its original board (while it is still powered) and quickly relocate the device to a dedicated board or socket which resumes powering the DRAM. In another attack, the malicious user can temporarily freeze the DRAM during removal which reduces the internal leakage of individual DRAM cells. During this process the DRAM may lose power for a brief time (generally on the order of tens of milliseconds). However, most of DRAM cells will not lose the content during this power interruption and the malicious user can then gain access to the contents of DRAM via the controlled board or socket.

The disclosed embodiments provide technical solutions to prevent this type of attack and similar attacks.

DETAILED DESCRIPTION

The disclosed embodiments describe methods, devices, and computer-readable media for protecting the integrity of volatile memory devices. In one embodiment, a method is disclosed comprising detecting a power interrupt condition of a memory device; and executing at least one operation in response to detecting the power interrupt condition, the operation selected from the group of operations consisting of: placing the memory device in a pre-charge mode, pausing a self-refresh mode of the memory device, forcing the memory device into a reset mode, or rewriting data in the memory device.

Figure 1:
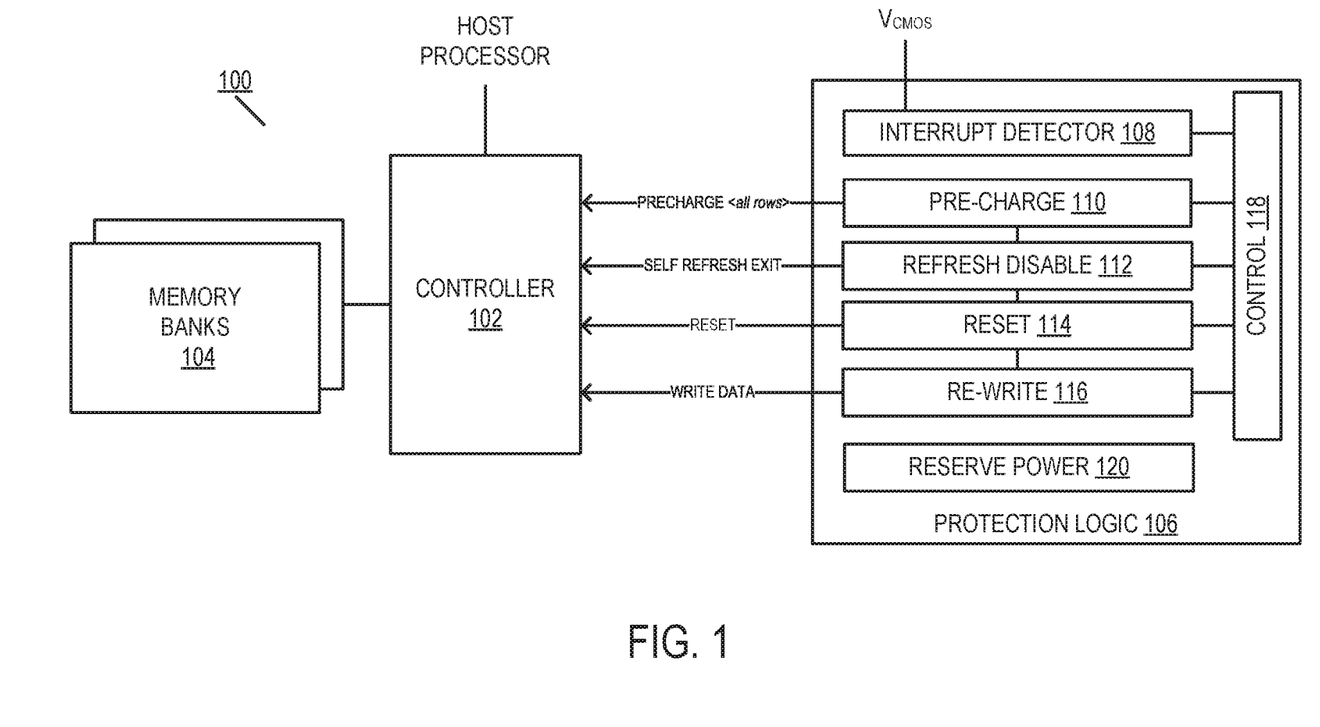
FIG. 1 is a block diagram illustrating a memory device according to some embodiments of the disclosure.

FIG. 1 is a block diagram illustrating a memory device (100) according to some embodiments of the disclosure. The illustrated device (100) includes memory banks (104), controller (102) and protection logic (106). The illustrated device (100) may include additional components not illustrated and the device (100) is not intended to be limited strictly to the components depicted.

In one embodiment, the device (100) comprises a dynamic random-access memory (DRAM) device. If implemented as a DRAM device, the device (100) can comprise synchronous DRAM (SDRAM), double data rate synchronous DRAM (DDR SDRAM), pseudostatic RAM (PSRAM) or any other type of DRAM. In other embodiments, the device (100) can comprise other types of memory devices such as Flash memory devices, static RAM (SRAM) devices, and other storage devices.

The memory banks (104) store data managed by the device (100). The banks (104) comprise logical storage locations for data managed by the device (100). In general, a bank comprises a set of rows and columns used to access individual cells. The specific details of accessing a memory bank are not included herein and any known or to-be-known methods of access memory banks may be used. In general, any techniques generally read, write, and erase data from the memory banks (104) and perform administrative and maintenance operations on the memory banks.

The controller (102) manages access to and from the memory banks (104). Generally, the controller (102) receives commands from a host processor and translates those commands into accesses of the memory banks (104). For instance, a host processor may request data stored at a memory address which causes the controller to access specific rows and columns of one or more of memory banks (104). The interactions between host processor, controller (102), and memory banks (104) described previously are not intended to be limiting and other variations of such interactions may be used in lieu of the explicitly described interactions.

The device (100) includes additional protection circuitry (106) that is configured to monitor the power state of the device (100) and perform one or more protective operations in response to the power state. A power state of a device (100) refers to whether the device is powered on, powered off, or is experiencing a power spike or drop. Other types of power conditions may be utilized.

As illustrated, the protection circuitry (106) monitors a complementary metal-oxide-semiconductor (CMOS) voltage ($V_{CMOS}$) of the device (100). The CMOS voltage comprises a reference voltage of digital electronics in the device (100). In general, the CMOS voltage represents the powering voltage for integrated circuits and other digital devices on the device (100) including the controller (102) and memory banks (104). The specific value of the CMOS voltage is not limiting, however voltages between 2.2 and 2.8 volts may be used as the CMOS voltage.

The interrupt detector (108) is connected to the CMOS voltage. The interrupt detector (108) comprises circuitry to detect a drop in the CMOS voltage. Various permutations of voltage detectors can be used in interrupt detector (108) to detect when the CMOS voltage drops below an allowable threshold. Upon detecting a drop in voltage beyond an allowable threshold, the interrupt detector (108) raises a signal informing the control module (118) that the CMOS voltage has dropped. In one embodiment, the interrupt detector (108) raises this signal immediately upon detecting a voltage drop or fluctuation. In other embodiments, the interrupt detector (108) employs a decay timer than can be used to pause for a predetermined amount of time (or amount of clock cycles) before raising the signal.

The illustrated control module (118) receives the voltage drop signal from interrupt detector (108) and enables one or more of the pre-charge logic (110), refresh disable logic (112), reset logic (114), and re-write logic (116). As will be described herein, the control module (118) can enable a single logic (110-116) or may enable a combination of these logics (110-116). Additionally, the control module (118) can enable the logics (110-116) in a pre-configured timing pattern. For purposes of FIG. 1, each logic (110-116) is described individually and reference is made to the flow diagrams for descriptions of combined operation. In the illustrated embodiment, the control module (118) comprises an integrated circuit or microcontroller. The control module (118) include firmware to perform the operations briefly described above and described in more detail herein.

In the illustrated embodiment, the logics (110-116) are illustrated as external to the control module. However, in some embodiments, the logics (110-116) are implemented by firmware in the control module (118) itself. Indeed, in some embodiments, the entire protection logic (106) can be implemented as an application specific circuit or system-on-a-chip.

In the illustrated embodiment, the pre-charge logic (110) is configured to force all rows of the memory banks into a pre-charge state. In one embodiment, the pre-charge logic (110) issues a command to the controller (102) causing the controller to pre-charge all cells within the memory banks (104). Details of the operation of the pre-charge logic (110) are described more fully in the description of FIG. 2.

In the illustrated embodiment, the refresh disable logic (112) is configured to disable a self-refresh mechanism of the device (100). In normal operation, the controller (102) periodically refreshes the data stored in the memory banks (104) by reading and writing back the data, thus avoiding data loss. In some devices, self-refresh mode is enabled when the device (100) is placed into standby mode. In other embodiments, self-refresh mode refers to any scenario where data is systematically read and written back to avoid data loss. In the illustrated embodiment, the refresh disable logic (112) issues a command to the controller (102) to disable any such refresh or self-refresh mechanism. In one embodiment, the refresh disable logic (112) maintains this command for a pre-determined amount of time. In some embodiments, the refresh disable logic (112) includes a temperature sensor (not illustrated) that monitors the temperature of the device (100). In some embodiments, the refresh disable logic (112) varies the pre-determined amount of time based on the current temperature. Details of the refresh disable logic (112) are described more fully in the description of FIG. 3.

In the illustrated embodiment, the reset logic (114) is configured to reset the memory banks (104) of the device (110). In one embodiment, the reset logic (114) is configured to issue a reset command to the controller (102) which causes the controller (102) to stop the internal machine clock, disable all input/output from/to the host processor, and clear all internal registers. In some embodiments, the reset command can also cause the controller (102) to pre-charge all data in the memory banks (104). Details of the reset logic (114) are described more fully in the description of FIG. 4.

In the illustrated embodiment, the re-write logic (116) is configured to re-write pre-determined data to the memory banks (104). The re-write logic (116) is configured to issue write commands to the controller (102) which in turn overwrites any existing data in the memory banks (104). The data written during the operation of the re-write logic (116) can comprise constant data (e.g., all zeros or all ones), random data, or pseudorandom data. Details of the re-write logic (116) are described more fully in the description of FIG. 5.

The protection logic (106) includes a reserve power source (120). In some embodiments, the reserve power source (120) comprises a battery-based power supply that can power each components of the protection circuity (106) if the CMOS voltage drops below an operating voltage of the protection logic. In some embodiments, the reserve power source (120) is optional. In these embodiments, the control module (118) can be equipped with a non-volatile memory (NVM) to record the voltage drop such that when powered up again by the CMOS voltage, the protection logic (106) can operate one or more of the logics (110-116) described above.

As will be described in more detail herein, the protection logic (106) operates to detect an interruption in CMOS voltage. This drop may potentially be caused by the removal of the memory device (100) from a socket, circuit board, or other intended connection point. Some malicious users may then immediately transfer the memory device (100) to a different connection point. Using the above protection logic (106), the memory device (100) securely removes all data from memory upon detecting this interruption (and subsequent re-establishment) of CMOS voltage. FIGS. 2-6, described next, provide further detail regarding the method employed by the protection logic (106).

Figure 2:
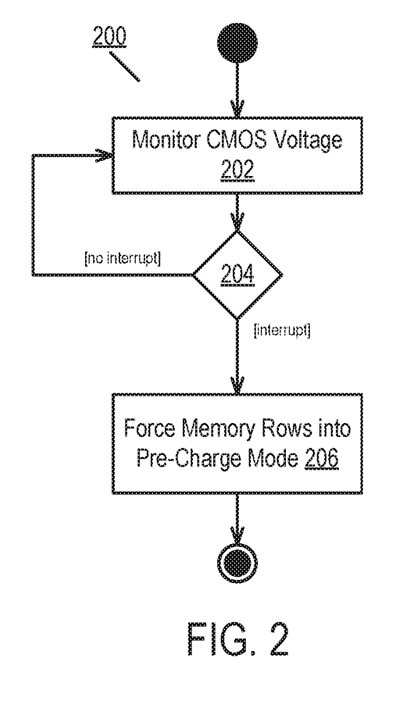
FIG. 2 is a flow diagram illustrating a method for protecting a memory device using a pre-charge mechanism according to some embodiments of the disclosure.

FIG. 2 is a flow diagram illustrating a method (200) for protecting a memory device using a pre-charge mechanism according to some embodiments of the disclosure. The method (200) can be performed by dedicated hardware or as software or firmware in a controller.

In block 202, the method (202) monitors a CMOS voltage of a memory device. In some embodiments, other voltages may be monitored. In some embodiments, the method (200) can monitor multiple voltages simultaneously, whereby the detection of interrupt on a single monitored voltage causes the method (200) to proceed.

In one embodiment, the method (200) utilizes a voltage detector, glitch detector, or other circuity to detect a voltage drop or loss. In one embodiment, the method (200) uses a comparator to compare a reference voltage (also referred to as an allowable threshold) to the CMOS voltage. The output of the comparator is high (i.e., 1) if the CMOS voltage is higher than the reference voltage and low (i.e., 0) if the CMOS voltage is lower than the reference voltage. The output of this circuit is used to monitor CMOS voltage source in block 202.

In block 204, the method (200) determines if an interrupt occurs. In one embodiment, the output of the comparator discussed above is used as an indication of whether an interrupt occurs. In this embodiment, immediately upon detecting a change in the output of the comparator the method (200) determines that an interrupt has occurred in block 204.

In other embodiments, the method (200) may not detect an interrupt immediately after detecting a voltage drop. In these embodiments, the method (200) may only detect an interrupt when the voltage drop exists for a pre-existing length of time or a pre-determined number of clock cycles.

In this embodiment, the method (200) detects the voltage drop and then starts a time or clock cycle decay timer. If the method (200) detects a voltage drop existing for the length of the decay timer, the method (200) detects an interrupt in block 204 upon the expiration of the timer. Alternatively, if the method (200) detects that the CMOS voltage returns to a suitable level during the decay timer, the method (200) restarts at block 202. In some embodiments, the method (200) can further ignore brief returns to the reference voltage during the decay timer. In this embodiment, the method (200) may only register a return to reference voltage if the return is greater than a second time or clock cycle threshold.

In block 206, after detecting a power interrupt, the method (200) forces all memory rows into a pre-charge mode.

In one embodiment, the method (200) issues a PREA (or similarly named) command to a controller of a memory device to initiate the pre-charge mode. In some embodiments, the method (200) individually pre-charges each memory bank of a memory device. In some embodiments, a single pre-charge command is issued to pre-charge all banks simultaneously. By forcing the cells into pre-charge mode, data stored by the memory banks will be erased.

Figure 3:
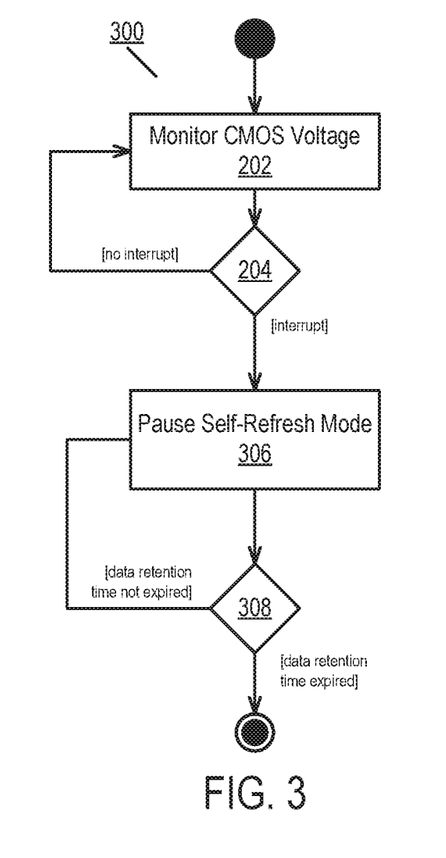
FIG. 3 is a flow diagram illustrating a method for protecting a memory device by using pausing a self-fresh mode according to some embodiments of the disclosure.

FIG. 3 is a flow diagram illustrating a method (300) for protecting a memory device by pausing a self-fresh mode according to some embodiments of the disclosure. The method (300) can be performed by dedicated hardware or as software or firmware in a controller.

In blocks 202 and 204, the method (300) monitors voltages to detect a power interruption. These blocks were previously described in the description of FIG. 2 and the operations described there are not repeated herein.

In block 306, the method (300) pauses a self-refresh mode of a memory device.

In some embodiments, self-fresh mode may additionally include temperature compensated self-refresh (TCSR), partial array self-refresh (PASR), deep power-down (DPD), or similar modes. In general, a memory device enters into a self-refresh mode to conserve energy. Frequently, the memory device enters self-refresh mode during a standby or other low-power state. In a vehicular context, a memory device installed in a vehicle will enter a self-refresh mode when the vehicle is turned off. As part of the self-refresh mode, the memory device will periodically read and re-write data from the memory banks according to a standard interval. This interval is sized based on the time to discharge a given memory cell in the banks. This interval can additionally be dynamically sized based on the temperature of the memory device. For example, at an operating temperature of 85° C., the interval may be set to approximately 32 milliseconds. For lower temperatures, the interval will be increased and for higher temperatures the interval will be decreased.

In one embodiment, pausing the self-refresh mode comprises issuing a command to the memory controller to exit the self-refresh mode. In one embodiment, the method (300) issues the command while the memory device is in a low-power state and does not issue further commands to bring the device into a normal operating state.

In block 308, the method (300) determines if the data retention time has expired.

As described above, the data retention time refers to the time a given memory cell can retain its value when powered off. This value can be static (i.e., a fixed amount of time) or dynamic (e.g., a function of the memory cell's temperature). In some embodiments, the data retention time comprises a temporal value (e.g., 32 milliseconds) while in other embodiments, the data retention time can be expressed as a function of clock cycles.

While the method (300) determines that the data retention time has not expired, the method (300) continues to maintain the self-refresh mode exit command that pauses the self-refresh mechanism of the memory device (block 306). Thus, while in low-power mode, the execution of block 306 causes every memory cell to release its value (i.e., by discharging the capacitance stored by each cell).

Upon detecting that the data retention time has expired, the method (300) ends. As such, at the termination of the method (300) all cells in the memory banks have lost any data stored within them and the memory bank is thus protected from extraction.

Figures 4, 5:
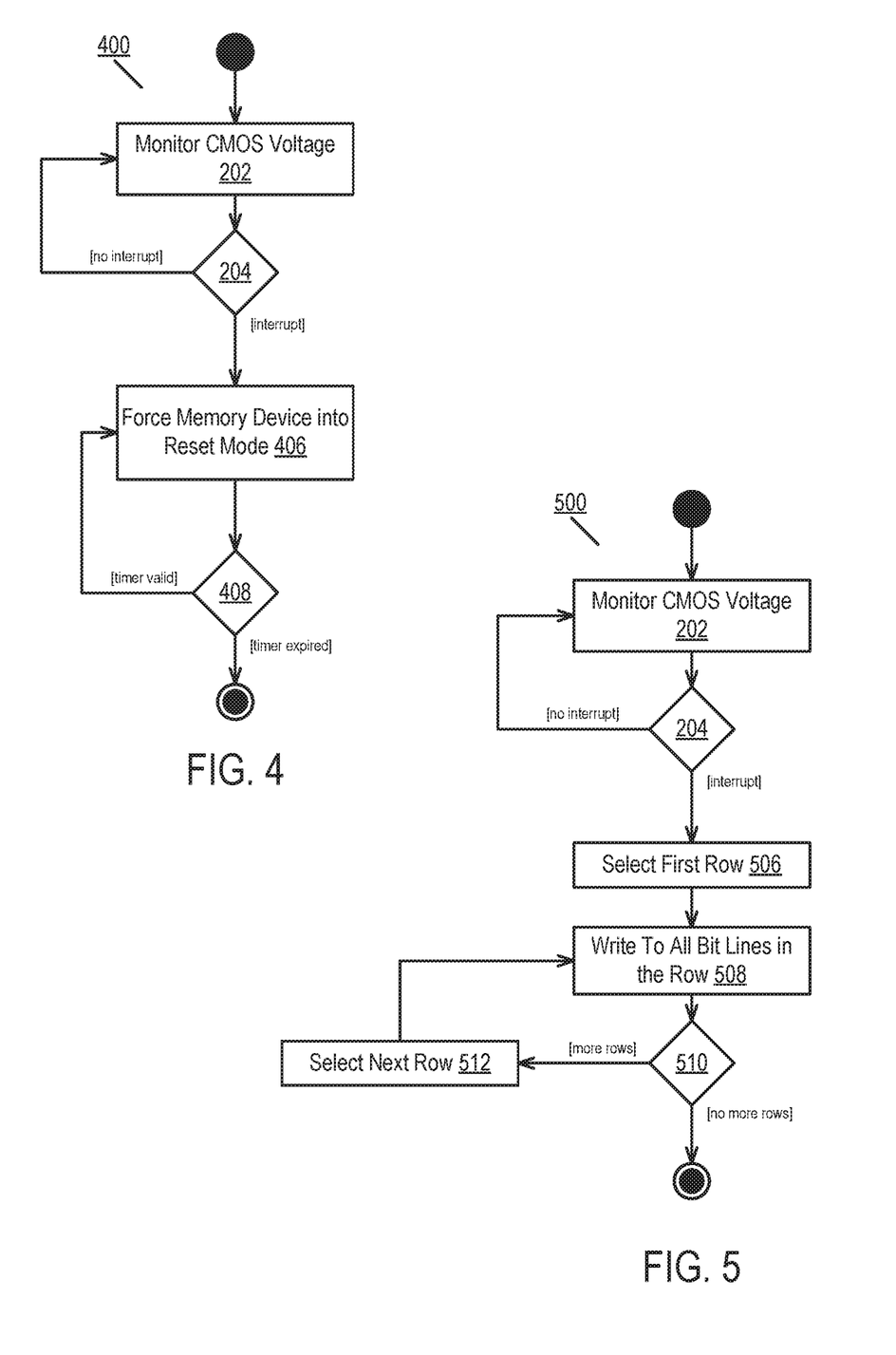
FIG. 4 is a flow diagram illustrating a method for protecting a memory device by maintaining a reset command according to some embodiments of the disclosure.
FIG. 5 is a flow diagram illustrating a method for protecting a memory device by overwriting a memory bank according to some embodiments of the disclosure.

FIG. 4 is a flow diagram illustrating a method (400) for protecting a memory device by maintaining a reset command according to some embodiments of the disclosure. The method (400) can be performed by dedicated hardware or as software or firmware in a controller.

In blocks 202 and 204, the method (400) monitors voltages to detect a power interruption. These blocks were previously described in the description of FIG. 2 and the operations described there are not repeated herein.

In block 406, the method (400) forces a memory device into a reset mode.

In one embodiment, forcing a memory device into a reset mode comprises stopping the clock of the memory device, disabling I/O pads of the device (driving the outputs to high impedance and disabling response to all input commands), and clearing all internal registers of the memory device. Differing memory devices may have differing reset procedures and the foregoing example is provided solely as an example operation of a reset instruction.

In general, the method (400) raises a reset signal which may be either active high or active low. During this time, the clock of the memory device may be disabled. In some embodiments, the method (400) may additionally disable a self-refresh mechanism and maintain the reset signal. This may comprise setting a mode register of the memory device. In alternative embodiments, the method (400) resets a memory device by power-cycling the memory device.

In block 408, the method (400) determines if a timer has expired.

In one embodiment, the method (400) maintains the reset signal for predefined period of time. In general, during a reset procedure, the contents of memory are presumed unknown. However, if the reset procedure is executed very quickly (i.e., shorter than the data retention time), there is a chance that the memory banks will retain their contents. Thus, the method (400) employs a counter to ensure that the reset signal is maintained longer than, for example, the data retention time. This timer can be similar or identical to the decay timer discussed previously.

If the timer is not expired, the method (400) continues to assert the reset signal. Once the timer expires, the method (400) de-asserts the reset signal and the memory device powers up according to its initialization procedure, and the method (400) ends.

FIG. 5 is a flow diagram illustrating a method (500) for protecting a memory device by overwriting a memory bank according to some embodiments of the disclosure. The method (500) can be performed by dedicated hardware or as software or firmware in a controller.

In blocks 202 and 204, the method (500) monitors voltages to detect a power interruption. These blocks were previously described in the description of FIG. 2 and the operations described there are not repeated herein.

In block 506, the method (500) selects a first row of data from a memory bank. In one embodiment, the method (500) starts at the first row of a memory bank (e.g., row zero).

In block 508, after selecting the first row, the method (500) writes to all bit lines of the row. In one embodiment, the method (500) writes a constant value (e.g., all ones or all zeros) to the bit lines of the row. In another embodiment, the method (500) writes random or pseudorandom data to the row. Various algorithms can be employed to generate the random or pseudorandom value and the specific algorithm used is not limiting.

In block 510, the method (500) determines if more rows need to be written to. In one embodiment, the method (500) maintains a state machine to iterate through each row of a memory bank. Additionally, in some embodiments, the method (500) maintains a bank counter and increment the bank counter after selecting each row in the bank, thus selecting all rows in the memory device.

If more rows remain, the method (500) selects the next row according to the state machine (block 512) and writes data to all bit lines (block 508) as described above. Once all rows have been written to, the method (500) ends. As such, at the end of method (500), the memory banks contain new, non-sensitive data, thwarting any extraction attempts.

Figure 6:
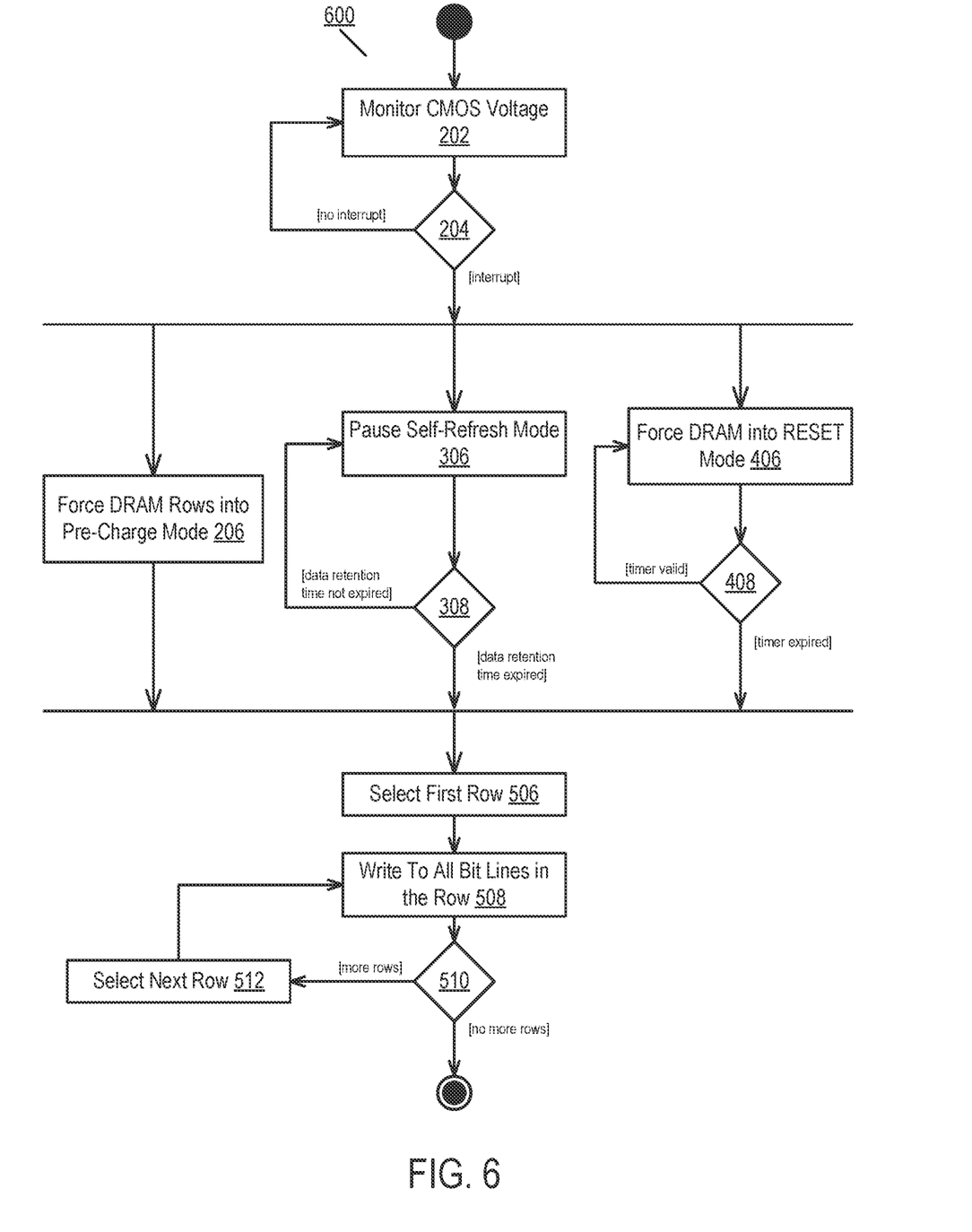
FIG. 6 is a flow diagram illustrating a method for protecting a memory device using a combination of techniques according to some embodiments of the disclosure.

FIG. 6 is a flow diagram illustrating a method (600) for protecting a memory device using a combination of techniques according to some embodiments of the disclosure. The method (600) can be performed by dedicated hardware or as software or firmware in a controller. The illustrated embodiment is merely one permutation of processes envisioned by the specification and is not intended to limit the disclosure. Notably, the illustrated embodiment combines the methods described previous in FIGS. 2-5 into a specific permutation of operations. Other permutations may be employed.

In blocks 202 and 204, the method (600) monitors voltages to detect a power interruption. These blocks were previously described in the description of FIG. 2 and the operations described there are not repeated herein.

In the illustrated embodiment, after detecting a power interrupt, the method (600) performs block 206, blocks 306 and 308, or blocks 406 and 408 (referred to herein as "preliminary operations"). These alternatives are described more fully in the descriptions of FIGS. 2 through 4, respectively, and those descriptions are not repeated herein. In the illustrated embodiment, the method (600) performs one of the preliminary operations before proceeding. In other embodiments, the method (600) can perform multiple preliminary operations before proceeding.

After performing one or more of the preliminary operations, the method (600) overwrites all data in the memory banks using the operations described in the description of FIG. 5, which is not repeated herein. After rewriting all data, the method (600) ends.

In the illustrated embodiment, the method (600) employs a two-stage protection procedure. In the first stage, the method (600) uses operations (e.g., pre-charge, reset, self-refresh disable) that are provided by the memory device in accordance with the timing considerations above. After those preliminary operations are executed, the method (600) then performs the second stage which comprises overwriting all data to ensure no data remains.

Figure 7:
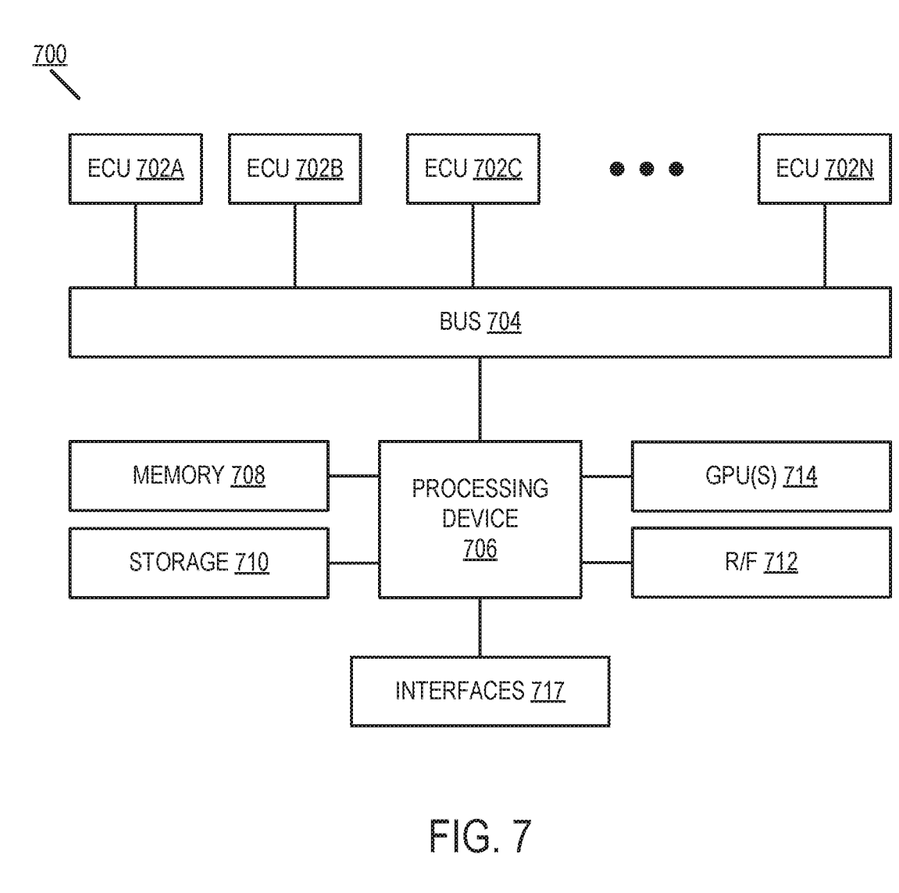
FIG. 7 is a block diagram illustrating a vehicle computing system according to some embodiments of the disclosure.

FIG. 7 is a block diagram illustrating a vehicle computing system according to some embodiments of the disclosure.

In FIG. 7, a vehicle (700) can comprise any type of vehicle (e.g., automobile, boat, etc.). Generally, vehicle can comprise any superstructure housing various discrete computing systems and a vehicle is provided as an example. Vehicle (700) includes one or more engine control unit (ECU) devices (702a-702n). Examples of ECUs include door control unit (DCU), engine control unit, electric power steering control unit (PSCU), human-machine interface (HMI), powertrain control module (PCM), seat control unit, speed control unit (SCU), telematic control unit (TCU), transmission control unit (TCU), brake control module (BCM; ABS or ESC), or battery management system (BMS) devices. While described primarily in the context of ECU devices, any type of embedded computing system may be used in the embodiments disclosed herein and embodiments referencing ECU devices are provided as examples.

ECUs (702a-702n) are each connected to a bus (704). In some embodiments, the bus (704) comprises a car area network (CAN) bus, FlexRay, MOST bus, or any other type of bidirectional communication bus.

The processing side of the system includes one or more processing devices (706), memory (708), a radio-frequency (R/F) system (712), GPUs (714), long-term storage (710) and one or more interfaces (718). Processing devices (706) can comprise any type of processing device such as CPUs, GPUs, FPGAs, etc. Memory device (708) is described more fully in the descriptions above. R/F system (712) may comprise a cellular transceiver and/or satellite transceiver. Long-term storage (710) may comprise one or more high-capacity solid-state drives (SSDs). In general, long-term storage (710) may be utilized to store, for example, high-definition maps, routing data, and any other data requiring permanent or semi-permanent storage. GPUs (714) may comprise one or more high throughput GPU devices for processing data received from other vehicle subsystems. Finally, interfaces (716) may comprise various display units positioned within the vehicle (e.g., an in-dash screen).

The present disclosure has been described more fully hereinafter with reference to the accompanying drawings, which form a part hereof, and which show, by way of illustration, certain example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used above may include a variety of meanings that may depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for the existence of additional factors not necessarily expressly described, again, depending at least in part on context.

The present disclosure has been described with reference to block diagrams and operational illustrations of methods and devices. It is understood that each block of the block diagrams or operational illustrations, and combinations of blocks in the block diagrams or operational illustrations, can be implemented by means of analog or digital hardware and computer program instructions. These computer program instructions can be provided to a general-purpose processor, a special-purpose computer, ASIC, or other programmable data processing apparatus, such that the instructions, which execute via the processor of the computer or other programmable data processing apparatus, implement the functions/acts specified in the block diagrams or operational block or blocks. In some alternate implementations, the functions/acts noted in the blocks can occur out of the order noted in the operational illustrations. For example, two blocks shown in succession can in fact be executed substantially concurrently or the blocks can sometimes be executed in the reverse order, depending upon the functionality/acts involved.

For the purposes of this disclosure a computer-readable medium (or computer-readable storage medium/media) stores computer data, which data can include computer program code (or computer-executable instructions) that is executable by a computer, in machine-readable form. By way of example, and not limitation, a computer-readable medium may comprise computer-readable storage media, for tangible or fixed storage of data, or communication media for transient interpretation of code-containing signals. Computer-readable storage media, as used herein, refers to physical or tangible storage (as opposed to signals) and includes without limitation volatile and non-volatile, removable, and non-removable media implemented in any method or technology for the tangible storage of information such as computer-readable instructions, data structures, program modules or other data. Computer-readable storage media includes, but is not limited to, RAM, ROM, EPROM, EEPROM, flash memory or other solid-state memory technology, CD-ROM, DVD, or other optical storage, magnetic cassettes, magnetic tape, magnetic disk storage or other magnetic storage devices, or any other physical or material medium which can be used to tangibly store the desired information or data or instructions and which can be accessed by a computer or processor.

What is claimed is:

1. A method comprising:
   detecting a power interrupt condition of a memory device;
   executing at least one operation in response to detecting the power interrupt condition, the operation selected from the group of operations consisting of:
   placing the memory device in a pre-charge mode,
   pausing a self-refresh mode of the memory device after entering the pre-charge mode, and
   forcing the memory device into a reset mode after pausing the self-refresh mode; and
   rewriting data in the memory device after executing the at least one operation.

2. The method of claim 1, the detecting the power interrupt condition comprising detecting a drop in voltage of the memory device.

3. The method of claim 1, the detecting the power interrupt condition comprising detecting the power interrupt condition while the memory device is in standby or normal mode.

4. The method of claim 1, the detecting the power interrupt condition comprising detecting the power interrupt condition of a dynamic random-access memory device.

5. The method of claim 1, the placing the memory device in the pre-charge mode comprising placing each row of the memory device in the pre-charge mode.

6. The method of claim 1, the pausing the self-refresh mode of the memory device comprising pausing the self-refresh mode for a predefined period of time, the predefined period time set based on a data retention time of cells of the memory device.

7. The method of claim 1, the forcing the memory device into the reset mode comprising forcing the memory device into the reset mode for pre-defined period of time.

8. The method of claim 1, the rewriting data in the memory device comprising selecting a row of the memory device and writing, to the row, one of a constant value, random value, or pseudo-random value to the row.

9. The method of claim 1, further comprising one or more of:
   powering the memory device using a reserve power source in response to detecting the power interrupt condition; and
   executing the at least one operation in response to detecting a restoration in power.

10. A device comprising:
    at least one memory bank;
    a controller coupled to the memory bank; and
    protection logic coupled to the controller and to a voltage source, the protection logic configured to:
    detect a power interrupt condition of the voltage source, and
    execute at least one operation in response to detecting the power interrupt condition, the operation selected from the group of operations consisting of:
    placing the device in a pre-charge mode,
    pausing a self-refresh mode of the device after entering the pre-charge mode, and
    forcing the device into a reset mode after pausing the self-refresh mode; and
    rewriting data in the memory bank after executing the at least one operation.

11. The device of claim 10, the detecting the power interrupt condition comprising detecting a drop in voltage of the voltage source.

12. The device of claim 10, the detecting the power interrupt condition comprising detecting the power interrupt condition while the device is in standby or normal mode.

13. The device of claim 10, the detecting the power interrupt condition comprising detecting the power interrupt condition of a dynamic random-access memory bank.

14. The device of claim 10, the placing the device in the pre-charge mode comprising placing each row of the memory bank in the pre-charge mode.

15. The device of claim 10, the pausing the self-refresh mode of the device comprising pausing the self-refresh mode for a predefined period of time, the predefined period time set based on a data retention time of cells of the memory bank.

16. The device of claim 10, the forcing the device into the reset mode comprising forcing the device into the reset mode for pre-defined period of time.

17. The device of claim 10, the rewriting data in the device comprising selecting a row of the memory bank and writing, to the row, one of a constant value, random value, or pseudo-random value to the row.

18. The device of claim 10, the protection logic further configured to:
 power the device using a reserve power source in response to detecting the power interrupt condition; and
 execute the at least one operation in response to detecting a restoration in power.

19. A non-transitory computer readable storage medium for tangibly storing computer program instructions capable of being executed by a computer processor, the computer program instructions defining steps of:
 detecting a power interrupt condition of a memory device;
 executing at least one operation in response to detecting the power interrupt condition, the operation selected from the group of operations consisting of:
  placing the memory device in a pre-charge mode,
  pausing a self-refresh mode of the memory device after entering the pre-charge mode, and
  forcing the memory device into a reset mode after pausing the self-refresh mode; and
 rewriting data in the memory device after executing the at least one operation.

20. The non-transitory computer readable storage medium of claim 19, the executing at least one operation comprising executing at least two operations selected from the group of operations.

* * * * *